US006890835B1

(12) United States Patent
Chu et al.

(10) Patent No.: US 6,890,835 B1
(45) Date of Patent: May 10, 2005

(54) LAYER TRANSFER OF LOW DEFECT SIGE USING AN ETCH-BACK PROCESS

(75) Inventors: Jack Oon Chu, Manhasset Hills, NY (US); David R. DiMilia, Wappingers Falls, NY (US); Lijuan Huang, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 414 days.

(21) Appl. No.: 09/692,606

(22) Filed: Oct. 19, 2000

(51) Int. Cl.[7] .......................... H01L 21/30; H01L 21/46; C30B 23/00; C30B 25/00; C30B 28/12; C30B 28/14; C30B 29/10

(52) U.S. Cl. .......................... 438/458; 438/459; 117/97; 117/939

(58) Field of Search ................................. 438/458, 459; 117/97, 939

(56) References Cited

U.S. PATENT DOCUMENTS

| | | | | |
|---|---|---|---|---|
| 4,826,787 A | * | 5/1989 | Muto et al. ................. 228/193 |
| 5,013,681 A | * | 5/1991 | Godbey et al. ............. 438/459 |
| 5,240,876 A | | 8/1993 | Gaul et al. .................. 437/131 |
| 5,298,452 A | | 3/1994 | Meyerson .................... 437/81 |
| 5,387,555 A | * | 2/1995 | Linn et al. .................. 438/455 |
| 5,462,883 A | | 10/1995 | Dennard et al. ............ 438/459 |
| 5,476,813 A | | 12/1995 | Naruse ....................... 438/311 |
| 5,569,620 A | * | 10/1996 | Linn et al. .................. 438/406 |
| 5,650,353 A | | 7/1997 | Yoshizawa et al. .......... 437/62 |
| 5,659,187 A | | 8/1997 | Legoues et al. ............ 257/190 |
| 5,906,951 A | * | 5/1999 | Chu et al. ................... 438/751 |
| 6,059,895 A | | 5/2000 | Chu et al. ................... 148/33.1 |
| 6,103,597 A | * | 8/2000 | Aspar et al. ................ 438/458 |
| 6,118,181 A | * | 9/2000 | Merchant et al. ........... 257/757 |
| 6,153,495 A | * | 11/2000 | Kub et al. ................... 438/459 |
| 6,255,731 B1 | * | 7/2001 | Ohmi et al. ................. 257/758 |
| 6,323,108 B1 | * | 11/2001 | Kub et al. ................... 438/458 |
| 6,328,796 B1 | * | 12/2001 | Kub et al. ..................... 117/94 |
| 6,521,041 B2 | * | 2/2003 | Wu et al. ...................... 117/94 |
| 6,573,126 B2 | * | 6/2003 | Cheng et al. ............... 438/149 |

FOREIGN PATENT DOCUMENTS

WO     WO 99/53539     10/1999     ......... H01L/21/306

OTHER PUBLICATIONS

Wolf, et al. Silicon Processing for the VLSI Era, vol. 1–Process Technology, 2nd ed., Lattic Press: Sunset Beach CA, 2000, pp. 386–391.*

T. Mizuno, "High Performance Strained–Si p–MOSFET's on SiGe–On–Insulator Substrates fabricated by SIMOX Technology", IEDM Tech. Digest 99–934, 1999.

* cited by examiner

*Primary Examiner*—Erik Kielin
(74) *Attorney, Agent, or Firm*—Scully, Scott, Murphy & Presser; Robert M. Trepp, Esq.

(57) ABSTRACT

A method for forming strained Si or SiGe on relaxed SiGe on insulator (SGOI) or a SiGe on Si heterostructure is described incorporating growing epitaxial $Si_{1-y}Ge_y$ layers on a semiconductor substrate, smoothing surfaces by Chemo-Mechanical Polishing, bonding two substrates together via thermal treatments and transferring the SiGe layer from one substrate to the other via highly seletive etching using SiGe itself as the etch-stop. The transferred SiGe layer may have its upper surface smoothed by CMP for epitaxial deposition of relaxed $Si_{1-y}Ge_y$, and strained $Si_{1-y}Ge_y$ depending upon composition, strained Si, strained SiC, strained Ge, strained GeC, and strained $Si_{1-y}Ge_yC$ or a heavily doped layer to make electrical contacts of the SiGe/Si heterojunction diodes.

28 Claims, 3 Drawing Sheets

LAYER TRANSFER OF LOW DEFECT SIGE USING AN ETCH-BACK PROCESS

FIELD OF INVENTION

This invention relates to transferring a SiGe layer onto a second substrate and forming a new material structure that has emerging applications in microelectronics and optoelectronics. In particular, a strained Si/SiGe layer on an insulator structure is useful for fabricating high speed devices such as complementary metal oxide semiconductor (CMOS) transistors, modulation doped field effect transistors (MODFETs), high electron mobility transistors (HEMTs), and bipolar transistors (BTs); SiGe layer on Si heterostructures can be used to produce photodetectors to provide Si-based far infrared detection for communication, surveillance and medical applications.

BACKGROUND OF THE INVENTION

For applications in microelectronics, high carrier mobilities are desirable. It has been found that electron mobility in strained Si/SiGe channels is significantly higher than that in bulk Si. For example, measured values of electron mobility in strained Si at room temperature are about 3000 cm$^2$/Vs as opposed to 400 cm$^2$/Vs in bulk Si. Similarly, hole mobility in strained SiGe with high Ge concentration (60%–80%) reaches up to 800 cm$^2$/Vs the value of which is about 5 times the hole mobility of 150 cm$^2$/Vs in bulk Si. The use of these materials in state-of-the-art Si devices is expected to result in much higher performances, higher operating speeds in particular. However, the underlying conducting substrate for MODFETs and HBTs or the interaction of the underlying substrate with active design region in CMOS are undesirable features which limit the full implementation of high speed devices. To resolve the problem, an insulating layer is proposed to isolate the SiGe device layer from the substrate. Therefore, there is a need for techniques capable of fabricating strained Si/SiGe on insulator materials.

There are two available techniques for making SiGe-On-Insulator (SGOI). One is via SIMOX as reported in a publication by T. Mizuno et al. entitled "High Performance Strained-Si p-MOSFETs on SiGe-on-Insulator Substrates Fabricated by SIMOX Technology," IEDM, 99-934. However, this method has several limits because the oxygen implantation induces further damages in the relaxed SiGe layer in addition to the existing defects caused by lattice mismatch. And, the high temperature anneal (>1100° C.) needed to form oxide after the oxygen implantation is detrimental to the strained Si/SiGe layers since Ge tends to diffuse and agglomerate at temperatures above 600° C., this effect becomes more significant when Ge content is higher than 10%.

The second technique of making SiGe on insulator is via selective etching with the aid of an etch stop. In U.S. Pat. No. 5,906,951 by J. O. Chu and K. E. Ismail which issued in May 1999, a method of utilizing wafer bonding and backside wafer etching in KOH with a p$^{++}$-doped SiGe etch-stop to transfer a layer of strained Si/SiGe on a SOI substrate was described. However, the etching selectivity of SiGe to p$^{++}$-doped SiGe etch-stop in KOH decreases sharply as the doping level in the etch stop layer is below 10$^{19}$/cm$^3$, therefore, the strained Si/SiGe layer may also be subjected to KOH etching if etching could not stop uniformly at the p$^{++}$ SiGe etch-stop layer due to variation of dopants in the p$^{++}$ etch-stop layer. Furthermore, since the SiGe etch-stop layer is heavily doped with boron in the range from about 5×10$^{19}$ to about 5×10$^{20}$/cm$^3$, there are chances of autodoping of the strained Si/SiGe during thermal treatment.

For fiberoptic applications, SiGe/Si heterojunction diodes are a good choice for demodulating 1.3–1.6 μm light at 300K. The use of 30% to 50% Ge is suggested to achieve absorption at the desired 1.3–1.6 μm wavelength and low defects such as dislocations in the SiGe layer is needed to enhance the photodetector sensitivity. The state-of-the-art technology to achieve SiGe/Si heterojunction diodes with higher responsivity, low noise, and fast response is to form a 100-period SiGe/Si strained layer superlattice. However, the SiGe alloy no longer behaves like the bulk material due to the quantum size effect. The net result of the quantum size effect is that the absorption occurs at wavelengths (1.1–1.3 μm) shorter than expected. Therefore, a bulk SiGe alloy with desirable Ge content and low defects is needed to fabricate photodetector that would absorb lights in the range of 1.3–1.6 μm.

The invention provides a method capable of transferring a low defect SiGe layer onto a desirable substrate using the etch-back method but without any additional heavily doped etch-stop layer. The key feature of this invention is that a SiGe layer serves both as the layer over which the epitaxial strained Si/SiGe is grown but also as an etch-stop layer itself in some specific etching solutions. In other words, the SiGe layer is a self-etch-stop in this case. As a result, the process of fabricating strained Si/SiGe on insulator or a SiGe/Si heterostructure is greatly simplified and the quality of the strained Si/SiGe or SiGe/Si heterostructure is significantly improved.

SUMMARY OF THE INVENTION

In accordance with the present invention, a method for transferring low defect SiGe bulk layer onto a second substrate and forming strained Si/SiGe on an insulator (SGOI) or SiGe/Si heterostructure is described. This approach comprises the steps of selecting a semiconductor substrate, forming a first expitaxial graded layer of $Si_{1-x}Ge_x$ over the semiconductor substrate, forming a second relaxed $Si_{1-y}Ge_y$ over the first graded $Si_{1-x}Ge_x$ layer, selecting a second substrate, bonding the first substrate to said second substrate to form a joined substrate, grinding and polishing the first substrate from its backside to remove the majority of said first substrate, etching the remaining material of the first substrate and stopping at the $Si_{1-x}Ge_x$ utilizing a SiGe highly selective wet etch process, applying chemical-mechanical planarization (CMP) to remove the defective portion of the graded $Si_{1-x}Ge_x$ layer, smoothing the surface of the $Si_{1-x}Ge_x$ layer by a CMP process step, growing strained Si/SiGe layers over the smoothed surface of the $Si_{1-x}Ge_x$ layer for MOSFET, MODFET, HEMT or BT for microelectronic applications, or growing SiGe photodectors for applications in optoelectronics.

The invention provides a method capable of transferring a low defect SiGe layer onto a desirable substrate using the etch-back method but without any additional heavily doped etch-stop layer. The key feature of this invention is that a SiGe layer serves both as the layer over which the epitaxial strained Si/SiGe is grown but also as an etch-stop layer itself in some specific etching solutions. In other words, the SiGe layer is a self-etch-stop in this case. As a result, the process of fabricating strained Si/SiGe on insulator or a SiGe/Si heterostructure is greatly simplified and the quality of the strained Si/SiGe or SiGe/Si heterostructure is significantly improved.

BRIEF DESCRIPTION OF THE DRAWING

The invention is described in more details thereinafter relative to non-limitative embodiments and with reference to the attached drawings, wherein show.

DETAILED DESCRIPTION OF THE PREFERRED EMBODIMENTS

The embodiment which will now be described in conjunction with the above drawings relates to the formation of a layer of monocrystalline strained Si/SiGe on an insulator material (SGOI) or a SiGe layer on Si with the aid of planarization of surfaces, wafer bonding and a selective wet etching process using SiGe as the etch-stop layer.

Figure 1:
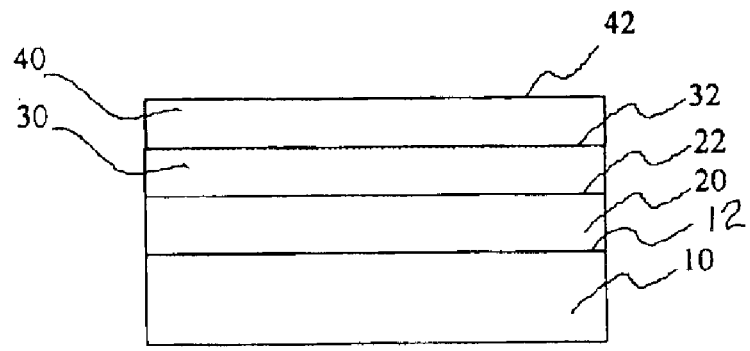
FIG. 1 is a cross section view of the first substrate with epitaxially grown graded $Si_{1-x}Ge_x$ and relaxed $Si_{1-y}Ge_y$ layers.
Figure 7:
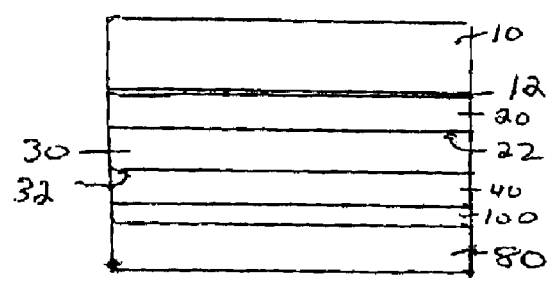
FIG. 7 is a cross section view of an alternative substrate similar to the substrate shown in FIG. 2 expect for the presence of intermediate agent layer 100.

The top surface of layer 40 shown in FIG. 1 is turned upside down and bought into intimate contact with surface 90 of substrate 80. The two surfaces 42 and 90 are brought together by the wafer bonding approach. The bonded surfaces of 42 and 90 are annealed at a temperature in the range from about 20° C. to about 500° C. for a time period in the range from about 2 hours to about 50 hours. Another embodiment, as shown in FIG. 7, uses at least one intermediate agent layer 100 such as Ge, or metal materials which either have a low-melting point or react with silicon to form a silicide such materials may be tungsten (W), cobalt (Co), titanium (Ti) etc. to achieve high bonding strength at anneal temperatures in the range from 100° C. to 800° C. The anneal can be either a furnace anneal or a rapid thermal anneal (RTA).

Epitaxial layer 30 is comprised substantially or completely of relaxed $Si_{1-y}Ge_y$ formed on upper surface 22 of layer 20. Layer 30 may have a thickness in the range from 200 nm to 1000 nm. The Ge content y in layer 30 is chosen to match the crystal lattice constant of upper surface 22 of layer 20 such that layer 30 is relaxed or essentially strain free. The Ge content y in layer 30 may be equal to or about the value of x at upper surface 22. The value y may be in the range from about 0.2 to about 0.5. An encapsulation layer 40 may be formed over the relaxed layer 30. Encapsulation layer 30 may be formed on upper surface 32 of layer 30 via PECVD, LPCVD, UHV CVD or spin-on techniques. Encapsulation layer 40 may have an upper surface 42. The encapsulation material may be, for example, Si, $SiO_2$, Poly Si, $Si_3N_4$, low-k dielectric materials, for example, Diamond Like Carbon (DLC), Fluorinated Diamond Like Carbon (FDLC), a polymer of Si, C, O, and H or a combination of any two or more of the foregoing materials. One example of a polymer of Si, C, O, and H is SiCOH which is described in U.S. Pat. No. 6,147,009 to Grill, et al. which is incorporated herein by reference. The deposition temperature for forming layer 40 may be below 900° C. The thickness of the encapsulation layer is in the range from 5 nm to about 500 nm. Encapsulation layer 40 functions to protect upper surface 32 of layer 30 or to provide an isolation layer.

Figure 2:
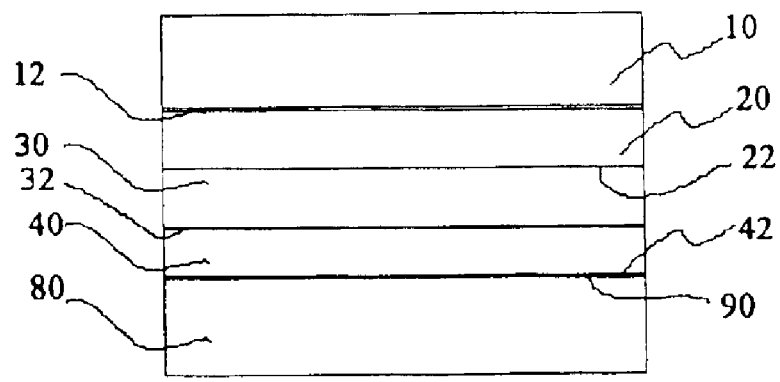
FIG. 2 is a cross section view of the first semiconductor substrate shown in FIG. 1 bonded to a second substrate with or without an insulator layer.

In FIG. 2, a second substrate 80 is bonded to upper surface 32 of layer 30 or to upper surface 42 of layer 40. Prior to wafer bonding, surface 32 of layer 30 or surface 42 of layer 40 is polished by a Chemo-Mechanical Planarization or Polishing (CMP) process to smooth surface 42 to a planar surface having a surface roughness in root mean square (RMS) in the range from about 0.3 nm to about 1 nm. Substrate 80 which may be a semiconductor such as Si, SiGe, SiGeC, SiC, sapphire, glass, ceramic, or metal and has an upper surface 90 which may be polished as above to provide a smooth upper surface 90 having a RMS in the range from about 0.3 nm to about 1 nm.

For a further description on polishing to reduce surface roughness, reference is made to Ser. No. 09/675,841 filed Sep. 29, 2000 by D. F. Canaperi et al. entitled "A Method of Wafer Smoothing for Bonding Using Chemo-Mechanical Polishing (CMP)" which is incorporated herein by reference.

For a further description on bonding wafers to provide a bonded structure, reference is made to Ser. No. 09/675,840 filed Sep. 29, 2000 by D. F. Canaperi et al. entitled "Preparation of Strained Si/SiGe on Insulator by Hydrogen Induced Layer Transfer Technique" which is incorporated herein by reference. The method of making SGOI by wafer bonding and H-implantation induced layer transfer is described in Ser. No. 09/675,840. This method can produce SiGe with higher Ge content onto an insulator compared to the prior art. Further, this method can reduce the amount of defects in th SiGe layer due to the elimination of the misfit dislocations compared to the prior art. However, with this method, the transferred SiGe layer is relatively thin (<1 $\mu$m) and transferring a high Ge content layer is still difficult to achieve due to implantation of H and annealing at 500 to 600° C. to induce layer transfer.

The top surface 42 of layer 40 shown in FIG. 1 is turned upside down and brought into contact with surface 90 of substrate 80. The two surfaces 42 and 90 are brought together by the wafer bonding approach. The bonded surfaces or 42 and 90 are annealed at a temperature in the range from about 20° C. to about 500° C. for a time period in the range from about 2 hours to about 50 hours. Another embodiment uses intermediate layers such as Ge, or metal materials which either have a low-melting point or react with silicon to form a silicide such materials may be tungsten (W), cobalt (Co), titanium (Ti) etc. to achieve high bonding strength at anneal temperatures in the range from 100° to 800° C. The anneal can be either a furnace anneal or a rapid thermal anneal (RTA).

Figure 3:
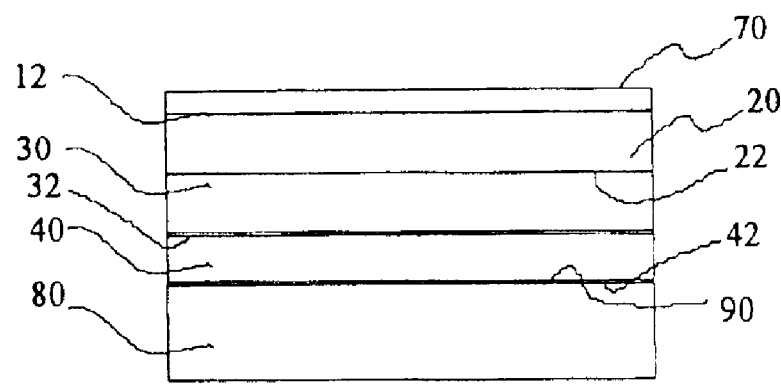
FIG. 3 is a cross section view of the first substrate shown in FIG. 2 thinned by grinding and polishing from its back side.

FIG. 3 shows the removal of the majority of the first substrate 10 which is in the range from about 600 $\mu$m to about 750 $\mu$m in thickness with a grinding or combination of grinding and polishing process. The remaining layer 70 of the first substrate 10 has a thickness in the range from about 50 $\mu$m to about 100 $\mu$m.

Figure 4:
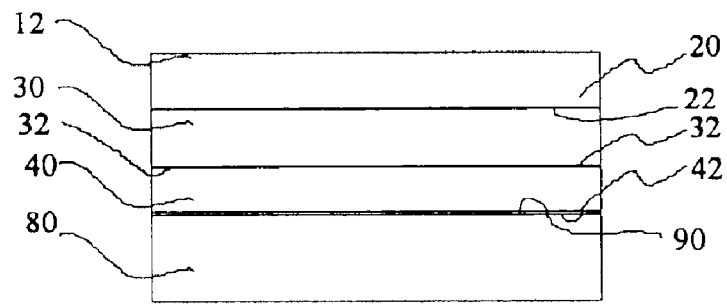
FIG. 4 is a cross section view of the remainder of the first substrate shown in FIG. 3 after the step of etching and stopping at the graded $Si_{1-x}Ge_x$ layer by a highly selective wet etching process.

FIG. 4 shows the removal of layer 70 such as with a wet etching process in a solution of ethylenediamine, pyrocatechol, pyrazine, water (EPPW or EDP) at a temperature in the range from about 90° C. to about 120° C. or in a solution of 20% KOH at a temperature in the range from about 70 to about 85° C. or in another organic Si etch solution of TMAH (tetramethyl ammoniumhydroxide, $(CH_3)_4NOH$). The etching selectivity of Si (100) to $Si_{1-x}Ge_x$ (y=0.15~0.3) in EPPW is experimentally determined to be in the range of 50–1800. The etching selectivity of Si (100) to $Si_{1-x}Ge_x$ (y=0.2~0.3) in KOH is experimentally determined to be in the range of 350–1280, and the etching selectivity of Si (100) to $Si_{1-x}Ge_x$ (y=0.2~0.3) in TMAH is experimentally determined to be in the range of 50–115. In a prior art of U.S. Pat. No. 5,476,813 which issued Dec. 19, 1995 to H. Naruse by a mixed solution of KOH, $K_2Cr_2O_7$, and propanol is used for selective etching of silicon while stopping at SiGe layer. However, a much lower selectivity of about 17 to 20 is achieved. In our invention, EPPW, KOH or TMAH has a much higher etching rate of Si compared to $Si_{1-y}Ge_y$ (y>0.1), as a result, the etching process stops nicely at the relaxed $Si_{1-y}Ge_y$ without any additional etch-stop layer such as the $p^{++}$ SiGe etch-stop as described in U.S. Pat. No. 5,906,951 which issued May 25, 1999 to J. O. Chu et al.

Figure 5:
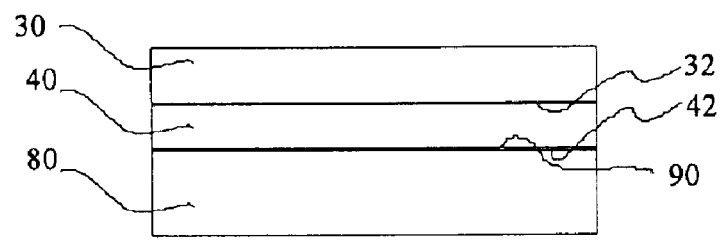
FIG. 5 is a cross section view of the remaaining $Si_{1-x}Ge_x$ layer from FIG. 4 polished away and the $Si_{1-y}Ge_y$ layer smoothed with a chemical-mechanical planarization (CMP) process.

FIG. 5 shows the cross-section view of a SiGe layer on insulator or a SiGe/Si heterostructure after applying a CMP process step to remove the step-graded $Si_{1-x}Ge_x$ layer 20. The structure has relaxed $Si_{1-y}Ge_y$ layer 30 on top. The chemical-mechanical planarization (CMP) process is used to remove the graded $Si_{1-x}Ge_x$ layer 20 and to adjust the thickness of the transferred relaxed $Si_{1-y}Ge_y$ layer 30. A final touch polishing and cleaning is used to smooth and clean the surface for epitaxial growth of strained Si/SiGe or for the deposition of a layer of $n^+$ Si as needed for forming a p-i-n photodetector.

Figure 6:
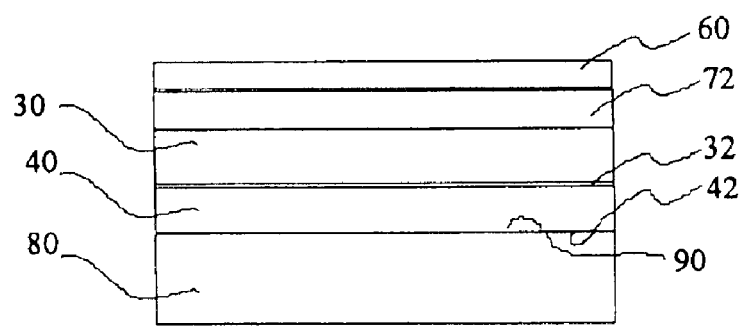
FIG. 6 is a cross section view of an epitaxially grown strained Si/SiGe layer or a p-i-n photodetector epitaxially grown over the smoothed $Si_{1-y}Ge_y$ layer from FIG. 5.

In FIG. 6, a layer 60 of strained Si/SiGe or of $n^+$ Si is epitaxially grown or formed over SiGe layer 30. For the epitaxial growth of strained Si/SiGe layer, an optional epitaxial SiGe buffer layer 72 over layer 30 may be needed before the growth of the strained Si/SiGe layer 60.

It should be noted in the drawing that like elements or components are referred to by like and corresponding reference numerals.

While there has been described and illustrated a method for forming strained Si or SiGe on SiGe on insulator (SGOI) or strained SiGe/Si heterostructure using wafer bonding and wet etching, it will be apparent to those skilled in the art that modifications and variations are possible without deviating from the broad scope of the invention which shall be limited solely by the scope of the claims appended hereto.

What is claimed is:

1. A method of preparing a relaxed SiGe layer on an insulator and a SiGe/Si heterostructure comprising the steps of:

forming a graded $Si_{1-x}Ge_x$ epitaxial layer on a first single crystalline semiconductor substrate, forming a relaxed $Si_{1-y}Ge_y$ epitaxial layer over said graded $Si_{1-x}Ge_x$ layer, wherein y, the germanium content of the relaxed $Si_{1-y}Ge_y$ epitaxial layer, is equal to or substantially equal to the value of x at an upper surface of the graded $Si_{1-x}Ge_x$ epitaxial layer, smoothing the surface of said relaxed $Si_{1-y}Ge_y$ epitaxial layer to provide a surface roughness in the range from about 0.3 nm to about 1 nm root mean square (RMS), selecting a structure having an upper surface and comprising a second substrate-having a surface roughness in the range from about 0.3 nm to about 1 nm RMS and an intermediate agent layer comprising a metal selected from the group consisting of W, Co Ti and any other metal that can react with silicon to form a metal silicide, and bonding said smoothed surface of said relaxed $Si_{1-y}Ge_y$ epitaxial layer on said first substrate to the upper surface of said structure including said second substrate, said step of bonding including the step of annealing to form sufficiently strong bonds across the bonding interface to form a single mechanical structure, whereby during said bonding said intermediate agent layer is converted into a metal silicide which includes germanium.

2. The method of claim 1 further including the step of smoothing the upper surface of said relaxed $Si_{1-y}Ge_y$ layer on said second substrate whereby additional epitaxial layers may be grown.

3. The method of claim 2 further including the step of growing an epitaxial layer of a material selected from the group consisting of $Si_{1-y}Ge_y$, Si, SiC, Ge, GeC, and $Si_{1-y}Ge_yC$.

4. The method of claim 3 wherein said $Si_{1-y}Ge_y$ material is selected with a value of y to provide a strained layer or to reduce the bandgap of SiGe to allow absorption of light in the infrared range (>1 um in wavelength).

5. The method of claim 1 further including the step of removing said first substrate.

6. The method of claim 1 wherein said relaxed $Si_{1-y}Ge_y$ layer on said second substrate has a thickness in the range from about 50 nm to about 1000 nm as determined by the layer structure formed on said first substrate.

7. The method of claim 1 wherein an encapsulation layer of a material selected from the group consisting of Si, $SiO_2$, Poly Si, and $Si_3N_4$ is formed on the surface of said relaxed SiGe layer of said first substrate.

8. The method of claim 7 wherein said encapsulation layer is formed and annealed at a temperature in the range from about 400° C. to about 900° C.

9. The method of claim 1 wherein said first substrate is selected from the group consisting of Si, SiGe, SiGeC, SiC, GaAs, and InP.

10. The method of claim 1 wherein said step of smoothing further includes the step of Chemical-Mechanical Planarization (CMP) to smooth said surface of said relaxed $Si_{1-y}Ge_y$ layer to provide a surface roughness in the range from about 0.3 nm to about 1 nm RMS.

11. The method of claim 1 wherein after said step of forming a relaxed $Si_{1-y}Ge_y$ epitaxial layer further includes the step of forming an encapsulation layer.

12. The method of claim 11 wherein said step of smoothing further includes the step of Chemical-Mechanical Planarization (CMP) to smooth the surface of said encapsulation layer to provide a surface roughness in the range from about 0.3 nm to about 1 nm RMS.

13. The method of claim 1 wherein an insulator layer is formed on said second substrate for the formation of strained Si/SiGe on insulator and a conducting layer is formed on said second substrate for the formation of p-i-n SiGe/Si heterodiodes.

14. The method of claim 13 wherein said insulator layer includes a material selected from the group consisting of $SiO_2$, $Si_3N_4$, $Al_2O_3$, $LiNbO_3$, low-k materials where k is less than 3.2, or the combination of two or more said materials.

15. The method of claim 13 wherein said conducting layer includes heavily doped p+ Si or p+ Poly Si.

16. The method of claim 13 wherein said insulator layer is formed by a process selected from the group consisting of PECVD, LPCVD, UHVCVD and spin-on techniques.

17. The method of claim 13 wherein said insulator layer is formed at a temperature in the range from about 400° C. to about 900° C.

18. The method of claim 1 wherein said second substrate is selected from the group consisting of Si, SiGe, SiGeC, SiC, GaAs, InP, sapphire, glass, quartz, $LiNbO_3$, and PLZT.

19. The method of claim 1 wherein said step of annealing includes thermal treatment cycles to form a strong bond at said bonded interface, said thermal treatment selected from the group consisting of furnace anneal, rapid thermal anneal (RTA) and combinations thereof.

20. The method of claim 19 wherein said step of annealing includes an anneal ambient selected from the group consisting of air, $N_2$ and Ar.

21. The method of claim 19 wherein said step of annealing includes the step of heating to a temperature in the range from about 100° C. to about 800° C.

22. The method of claim 5 wherein a highly selectively wet etching process is used to remove Si substrate of said first substrate.

23. The method of claim 22 wherein EPPW, KOH or TMAH is used as the wet etchant.

24. The method of claim 22 wherein the wet etching in EPPW, KOH or TMAH is at a temperature in the range from about 70° C. to about 120° C.

25. The method of claim 22 wherein said step of Chemo-Mechanical Polishing (CMP) includes removing said step-graded $Si_{1-x}Ge_x$ layer and to polish the exposed $Si_{1-y}Ge_y$ relaxed to provide a smoothness in the range from about 0.3 nm to about 1 nm.

26. The method of claim 22 wherein a relaxed $Si_{1-y}Ge_y$ layer may be epitaxially grown on said top surface of said smoothed relaxed $Si_{1-y}Ge_y$ layer.

27. The method of claim 24 wherein said step of epitaxially growing said relaxed $Si_{1-y}Ge_y$ layer includes growing to a thickness in the range from about 50 nm to about 500 nm.

28. The method of claim 22 further including the step of growing one of strained Si or strained SiGe or deposition of a n+ Poly Si layer on said smoothed relaxed $Si_{1-y}Ge_y$ layer.

* * * * *

UNITED STATES PATENT AND TRADEMARK OFFICE
CERTIFICATE OF CORRECTION

PATENT NO.    : 6,890,835 B1
DATED         : May 10, 2005
INVENTOR(S)   : Jack Oon Chu et al.

It is certified that error appears in the above-identified patent and that said Letters Patent is hereby corrected as shown below:

Title page,
Item [57], ABSTRACT,
Line 13, "contact for the SiGe/Si" should read -- contact of the SiGe/Si --.

Signed and Sealed this

Eleventh Day of October, 2005

JON W. DUDAS
*Director of the United States Patent and Trademark Office*